United States Patent
Ptacek

(10) Patent No.: US 10,630,276 B2
(45) Date of Patent: Apr. 21, 2020

(54) PULSE WIDTH DEMODULATOR

(71) Applicant: SEMICONDUCTOR COMPONENTS INDUSTRIES, LLC, Phoenix, AZ (US)

(72) Inventor: Karel Ptacek, Roznov Pod Radhostem (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/128,681

(22) Filed: Sep. 12, 2018

(65) Prior Publication Data

US 2020/0083876 A1    Mar. 12, 2020

(51) Int. Cl.
*H03K 9/08* (2006.01)
*G11C 27/02* (2006.01)

(52) U.S. Cl.
CPC ............. *H03K 9/08* (2013.01); *G11C 27/026* (2013.01)

(58) Field of Classification Search
CPC ........................................................ H03K 9/08
USPC ........................................................ 329/312
See application file for complete search history.

(56) References Cited

U.S. PATENT DOCUMENTS

| 3,593,170 | A | * | 7/1971 | Gassmann | G01R 29/0273 |
| | | | | | 329/312 |
| 4,510,453 | A | * | 4/1985 | Sun | H03D 3/04 |
| | | | | | 329/312 |
| 8,629,716 | B2 | * | 1/2014 | Han | H04L 27/12 |
| | | | | | 329/300 |
| 9,843,285 | B1 | * | 12/2017 | Lu | H02P 27/08 |
| 2007/0176706 | A1 | * | 8/2007 | Kim | H03K 9/08 |
| | | | | | 332/109 |
| 2017/0237420 | A1 | * | 8/2017 | Lindemann | H03K 7/08 |
| | | | | | 332/107 |

* cited by examiner

*Primary Examiner* — Levi Gannon
(74) *Attorney, Agent, or Firm* — AMPACC Law Group, PLLC

(57) ABSTRACT

A simple, fast, easily designed circuit for demodulating a PWM signal produces an output signal indicating a duty cycle of a received PWM signal. The circuit may include a low pass filter circuit to receive a Pulse Width Modulated (PWM) signal and produce a triangular signal, a track-and-hold circuit to receive the PWM signal and the triangular signal and produce a minimum and maximum signals corresponding to minimum and maximum values of the triangular signal during each cycle of the PWM signal, and an averaging circuit to receive the minimum signal and the maximum signal and produce, by averaging the values of the minimum signal and the maximum signal, the output signal.

20 Claims, 3 Drawing Sheets

PULSE WIDTH DEMODULATOR

FIELD OF THE DISCLOSURE

The present disclosure relates generally to circuits and processes for demodulating a Pulse Width Modulated (PWM) signal.

BACKGROUND

The present disclosure relates, in general, to electronics, and more particularly, to circuits and processes for demodulating a Pulse Width Modulated (PWM) signal. Demodulating a PWM signal produces an output signal having a value indicating a duty cycle of the PWM signal. For example, a voltage value of the output signal may have a value proportional to the duty cycle of the PWM signal.

Technologies for demodulating PWM signals may suffer from insufficient resolution, insufficient bandwidth or slow response times, significant output ripple, complex implementation requiring skilled engineering, a need for trimming in production, or high bill-of-material costs. Some technologies may require an additional clock signal, which may need to have a frequency that is several times the frequency of the PWM signal being demodulated.

It would be advantageous to have circuits and processes for demodulation a PWM signal that provided good resolution, fast settling time, low or no voltage ripple in the output, ease of implementation, ease of use, and a low bill-of-materials cost.

BRIEF DESCRIPTION OF THE FIGURES

In the accompanying figures, like reference numerals refer to identical or functionally similar elements throughout the separate views. The figures, together with the detailed description below, are incorporated in and form part of the specification to further illustrate embodiments of concepts that include the claimed invention and explain various principles and advantages of those embodiments.

Figure 1A:
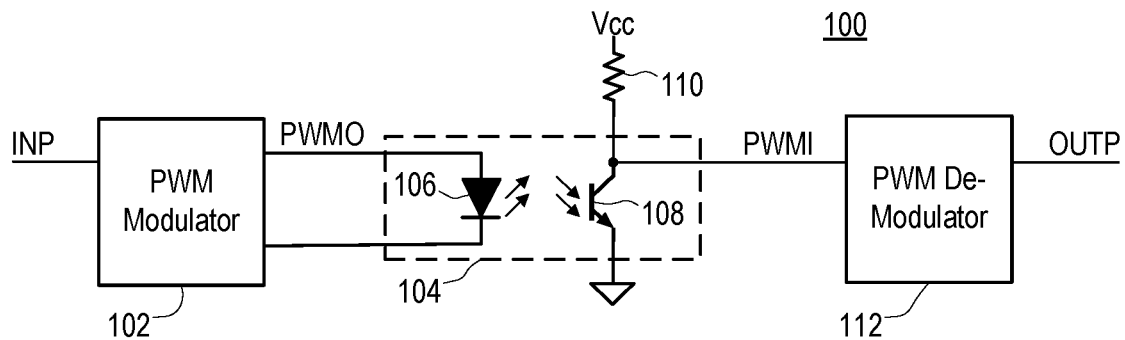
FIG. 1A illustrates a galvanic isolation circuit including a PWM demodulator circuit according to an embodiment.

Those skilled in the field of the present disclosure will appreciate that elements in the figures are illustrated for simplicity and clarity and have not necessarily been drawn to scale. For example, the dimensions of some of the elements in the figures may be exaggerated relative to other elements to help to improve understanding of the embodiments.

The apparatus and process components have been represented where appropriate by conventional symbols in the drawings, showing only those specific details that are pertinent to understanding the embodiments. This avoids obscuring the disclosure with details that will be readily apparent to those of ordinary skill in the art having the benefit of the disclosures herein. The details of well-known elements, structures, or processes that are necessary to practice the embodiments and that are well known to those of skill in the art may not be shown and should be assumed present unless otherwise indicated.

DETAILED DESCRIPTION

Embodiments relate generally to electronics, and more particularly, to Pulse Width Modulation (PWM) demodulation circuits.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

Embodiments operate to convert a PWM signal into an analog signal having a value (such as a current value or a voltage value) corresponding to a duty cycle of the PWM signal.

In an embodiment, a circuit comprises a low pass filter circuit to receive a Pulse Width Modulated (PWM) signal and produce a low pass filtered (LPF) signal, a track-and-hold circuit to receive the PWM signal and the LPF signal and produce, using the PWM signal and the LPF signal, a minimum signal and a maximum signal; and an averaging circuit to receive the minimum signal and the maximum signal and produce, using the minimum signal and the maximum signal, an output signal, wherein a value of the output signal corresponds to a duty cycle of the PWM signal.

In an embodiment, a simple, fast, easily designed circuit produces an output signal indicating a duty cycle of a received PWM signal, without requiring an additional clock signal and without requiring trimming during production. The circuit generates a triangular signal that increases in response to the PWM signal having a first value (e.g., a logical 1) and decreases in response to the PWM signal having a second value (e.g., a logical 0). The circuit determines minimum and maximum values of the triangular signal during each cycle of the PWM signal, and averages the minimum and maximum values to produce the output signal. The triangular signal may be generated by, for example, low-pass filtering the PWM signal. Determining the minimum and maximum values may be performed using sample-and-hold circuits controlled using the PWM signal.

FIG. 1A illustrates a galvanic isolation circuit 100 including a PWM demodulator circuit 112 according to an embodiment. The galvanic isolation circuit 100 further includes a PWM modulator circuit 102, an opto-isolator 104, and a resistor 110. The galvanic isolation circuit 100 operates to generate an output signal OUTP having a value corresponding to a value of an input signal INP, where the input signal INP and the output signal OUTP may respectively be in different electrically-isolated circuit domains.

Figure 1B:
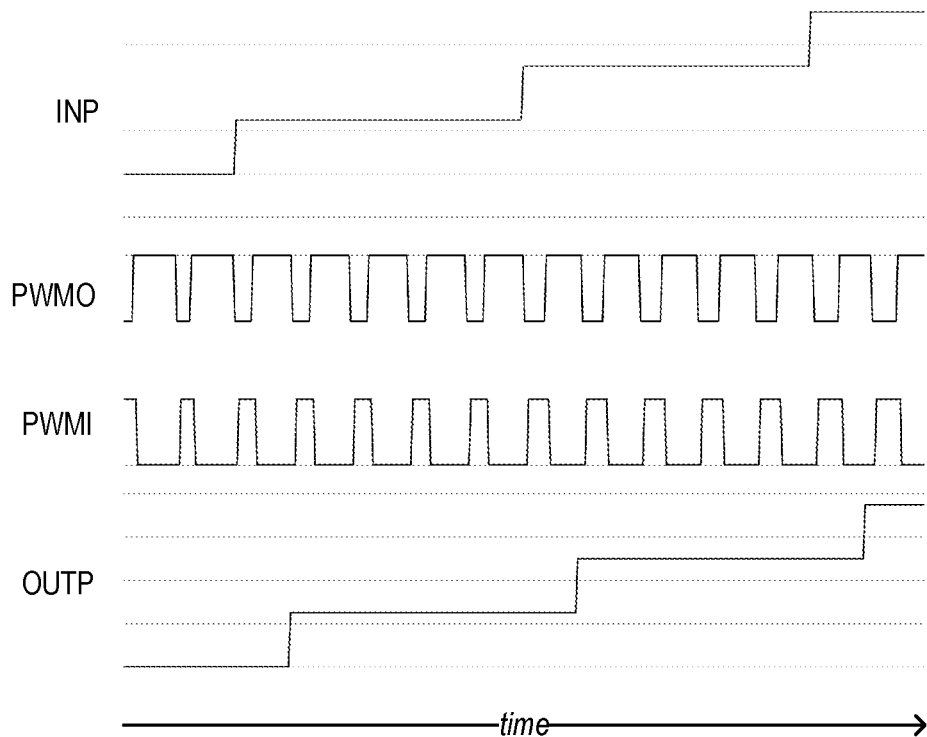
FIG. 1B illustrates signal waveforms during operation of the galvanic isolation circuit of FIG. 1A according to an embodiment.

FIG. 1B illustrates signal waveforms during operation of the galvanic isolation circuit 100 of FIG. 1A according to an embodiment. The waveforms illustrated include the input signal INP, a PWM output signal PWMO, a PWM input signal PWMI, and the output signal OUTP.

The PWM modulator circuit 102 receives the input signal INP and generates a PWM output signal PWMO having a duty cycle proportional to a value of the input signal INP. The PWM output signal PWMO is provided to a transmitter side of the opto-isolator 104.

A Light Emitting Diode (LED) 106 of the opto-isolator 104 emits light when the PWM output signal PWMO is asserted, and does not emit light when the PWM output signal PWMO is de-asserted. An opto-transistor 108 of the opto-isolator 104 turns on (i.e., conducts current) when it receives the light emitted by the LED 106, and turns off otherwise. The opto-transistor 108 pulls down the PWM input signal PWMI when it is on. When the opto-transistor 108 is off, the resistor 110 pulls up the PWM input signal PWMI.

In the embodiment illustrated in FIG. 1A, because the opto-isolator 104 produces the PWM input signal PWMI that is inverted with respect to the PWM output signal PWMO, the PWM modulator 102 produces the PWM output signal PWMO having a lower duty cycle when the value of the input signal INP is high and a higher duty cycle when the value of the input signal INP is low, so that the duty cycle of the PWM input signal PWMI is proportional to the value of the input signal INP.

The PWM demodulator circuit 112 produces the output signal OUTP having a value proportional to the duty cycle of the PWM input signal PWMI. In the embodiment shown in FIGS. 1A and 1B, the output signal OUTP is delayed, relative to the input signal INP, by one clock cycle of the PWM modulator 102. That is, the value of the output signal OUTP during one clock cycle of the PWM modulator 102 corresponds to the value of the input signal INP during an immediately preceding clock cycle of the PWM modulator 102.

Figure 2:
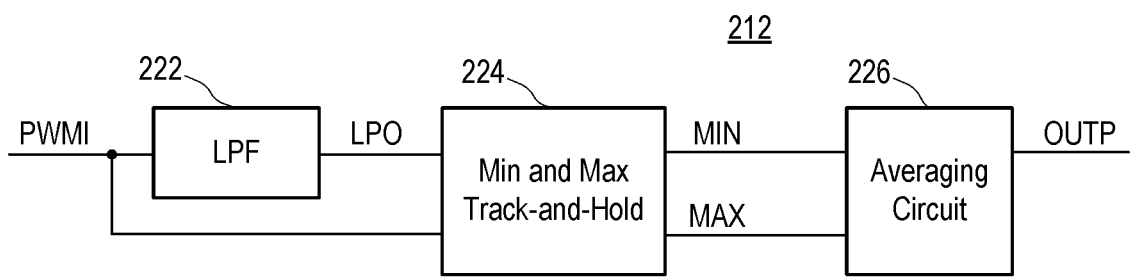
FIG. 2 illustrates a PWM demodulator circuit according to an embodiment.

FIG. 2 illustrates a PWM demodulator circuit 212 according to an embodiment. The PWM demodulator circuit 212 is suitable for use as a PWM demodulator circuit in a galvanic isolation circuit (such as the PWM demodulator circuit 112 of the galvanic isolation circuit 100 of FIG. 1A), but embodiments are not limited to such uses. The PWM demodulator circuit 212 includes a Low-Pass Filter circuit (LPF) 222, a Minimum and Maximum Track and Hold (MinMax T&H) circuit 224, and an averaging circuit 226. The PWM demodulator circuit 212 receives an input PWM signal PWMI and produces an output signal OUTP having a value (such as a voltage value or a current value) indicating a duty cycle of the input PWM signal PWMI.

The LPF 222 receives the input PWM signal PWMI and low-pass filters it to produce a Low Pass Output signal LPO. The Low Pass Output signal LPO is a triangular signal having a value that increases in response to the input PWM signal PWMI being asserted and decreases in response to the input PWM signal PWMI being de-asserted. In embodiments, the LPF 222 includes a resistor-capacitor (RC) low pass filter circuit, an inductor-capacitor (LC) low pass filter circuit, or the like.

The MinMax T&H circuit 224 receives the Low Pass Output signal LPO and generates a minimum signal MIN having a value corresponding to a most-recent minimum value (such as a most recent minimum voltage value) of the Low Pass Output signal LPO and a maximum signal MAX having a value corresponding to a most-recent maximum value (such as a most recent maximum voltage value) of the Low Pass Output signal LPO.

In an embodiment, the MinMax T&H circuit 224 determines minimum and maximum values of the Low Pass Output signal LPO using the input PWM signal PWMI. In an illustrative embodiment, a falling edge of the input PWM signal PWMI corresponds to a time of a maximum value of the Low Pass Output signal LPO, and a rising edge of the input PWM signal PWMI corresponds to a time of a minimum value of the Low Pass Output signal LPO.

The averaging circuit 226 receives the minimum signal MIN and the maximum signal MAX and produces the output signal OUTP having a value proportional to an average of the value of the minimum signal MIN and the value of the maximum signal MAX.

Figure 3A:
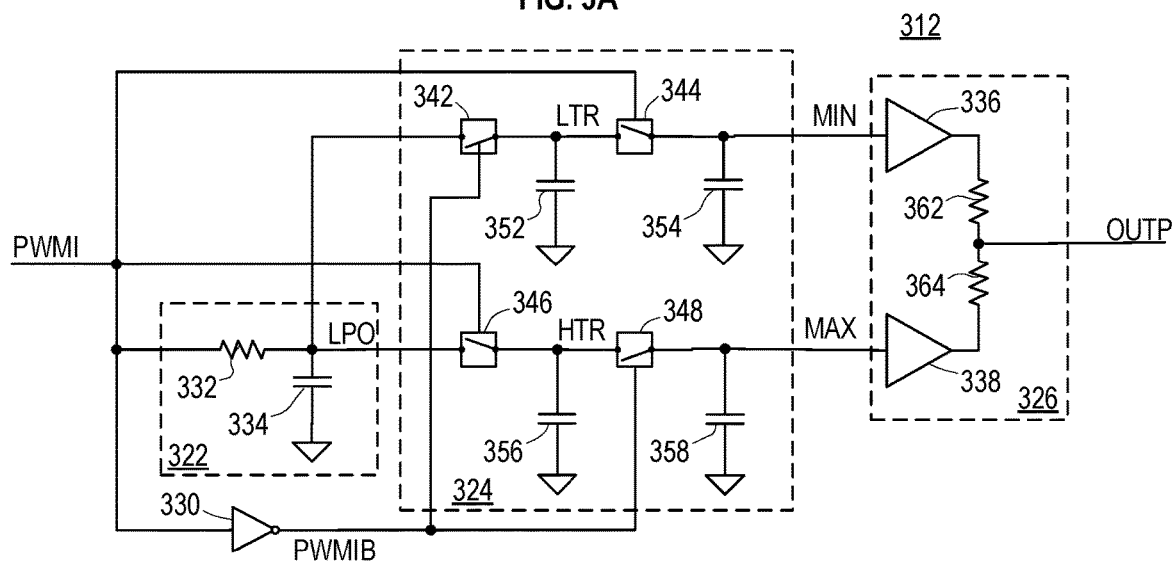
FIG. 3A illustrates a PWM demodulator circuit according to an embodiment.

FIG. 3A illustrates a PWM demodulator circuit 312 according to an embodiment, such as may be used to implement the PWM demodulator circuit 212. The operations of the LPF 322, MinMax T&H circuit 324, and averaging circuit 326 of the PWM demodulator circuit 312 are as described for the LPF 222, MinMax T&H circuit 224, and averaging circuit 226, respectively, of the PWM demodulator circuit 212 of FIG. 2, so descriptions thereof are omitted for brevity.

The PWM demodulator circuit 312 further includes an inverter 330 that receives the PWM input signal PWMI and produces an inverted PWM input signal PWMIB.

The LPF 322 includes an RC low pass filter comprising a filter resistor 332 coupled between the PWM input signal PWMI and a first terminal of a filter capacitor 334. A second terminal of the filter capacitor 334 is coupled to ground. The Low Pass Output signal LPO is produced at the first terminal of the capacitor 334.

The MinMax T&H circuit 324 includes a minimum value track and hold circuit (shown in the upper half) and a maximum value track and hold circuit (shown in the lower half). Each of the minimum value track and hold circuit and the maximum value track and hold circuit comprise a pair of sample-and-hold stages connected in series, as described below.

The minimum value track and hold circuit including a first low stage switch 342, a first low stage capacitor 352, a second low stage switch 344, and a second low stage capacitor 354. The first low stage switch 342 is coupled between the low pass filter output signal LPO and a first terminal of the first low stage capacitor 352, and a control terminal of the first low stage switch 342 receives the inverted PWM input signal PWMIB. The second low stage switch 344 is coupled between the first terminal of the first low stage capacitor 352 and a first terminal of the second low stage capacitor 354, and a control terminal of the second low stage switch 344 receives the PWM input signal PWMI. A low tracking signal LTR is produced at the first terminal of the first low stage capacitor 352, and a minimum signal MIN is produced at the first terminal of the second low stage capacitor 354.

The maximum value track and hold circuit including a first high stage switch 346, a first high stage capacitor 356, a second high stage switch 348, and a second high stage capacitor 358. The first high stage switch 346 is coupled between the low pass filter output signal LPO and a first terminal of the first high stage capacitor 356, and a control terminal of the first high stage switch 346 receives the PWM input signal PWMI. The second high stage switch 348 is coupled between the first terminal of the first high stage capacitor 356 and a first terminal of the second high stage capacitor 358, and a control terminal of the second high stage switch 348 receives the inverted PWM input signal PWMIB. A high tracking signal HTR is produced at the first terminal of the first high stage capacitor 356, and a maximum signal MAX is produced at the first terminal of the second high stage capacitor 358.

In embodiments, the switches 342, 344, 346, and 348 may each include one or more switching devices such as Field Effect Transistors (FETs), bipolar junction transistors (BJTs), and combinations thereof.

The averaging circuit 326 includes a first buffer amplifier 336, a second buffer amplifier 338, a first averaging resistor 362, and a second averaging resistor 364. In an embodiment, voltage gains of the first and second buffer amplifiers 336 and 338 are substantially the same, and resistance values of the first and second averaging resistors 362 and 364 are substantially the same. The averaging circuit 326 produces an output signal OUTP having a value proportional to an average of the respective values of the minimum signal MIN and the maximum signal MAX.

Figure 3B:
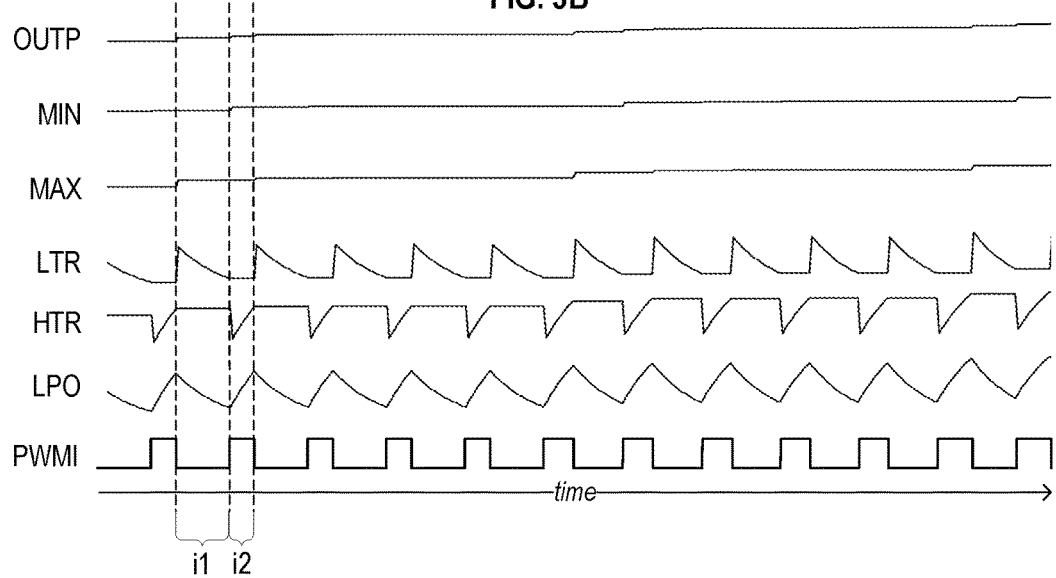
FIG. 3B illustrates signal waveforms during operation of the PWM demodulator circuit of FIG. 3A according to an embodiment.

FIG. 3B illustrates signal waveforms during operation of the PWM demodulator circuit 312 of FIG. 3A according to an embodiment, and operation of the MinMax T&H circuit 324 will be described with reference to FIGS. 3A and 3B.

During a first interval i1, the PWM input signal PWMI is de-asserted. As a result of the PWM input signal PWMI being de-asserted, the first high stage switch 346 and the second low stage switch 344 are turned off, and the inverted PWM input signal PWMIB is asserted. As a result of the assertion of the inverted PWM input signal PWMIB, the first low stage switch 342 and the second high stage switch 348 are turned on.

As a result of the first low stage switch 342 being on, a value of the low tracking signal LTR tracks a value of the low pass output signal LPO during the first interval i1. As a result of the second low stage switch 344 being off, a value of the minimum signal MIN is maintained at a value equal to the voltage value at the beginning of the first interval i1 of the low tracking signal LTR.

As a result of the first high stage switch 346 being off, a value of the high tracking signal HTR is maintained at a value equal to the voltage value at the beginning of the first interval i1 of the low pass output signal LPO. As a result of the second high stage switch 348 being on during the first interval i1, a value of the maximum signal MAX tracks the value of the high tracking signal HTR, which is constant during the first interval i1.

During a second interval i2, the PWM input signal PWMI is asserted. As a result of the PWM input signal PWMI being asserted, the first high stage switch 346 and the second low stage switch 344 are turned on, and the inverted PWM input signal PWMIB is de-asserted. As a result of the de-assertion of the inverted PWM input signal PWMIB, the first low stage switch 342 and the second high stage switch 348 are turned off.

As a result of the first low stage switch 342 being off, a value of the low tracking signal LTR is maintained at a value equal to the voltage value at the beginning of the second interval i2 of the low pass output signal LPO. As a result of the second low stage switch 344 being on, during the second interval i2 the value of the minimum signal MIN tracks the value of the low tracking signal LTR, which is constant during the second interval i2.

As a result of the first high stage switch 346 being on, a value of the high tracking signal HTR tracks a value of the low pass output signal LPO during the second interval i2. As a result of the second high stage switch 348 being off, a value of the maximum signal MAX is maintained at a value equal to the voltage value at the beginning of the second interval i2 of the high tracking signal HTR.

In a steady-state condition, during which the duty cycle k of the PWM input signal PWMI is not changing, a value $V_{MIN}$ of the minimum signal MIN and a value $V_{MAX}$ of the maximum signal MAX are respectively equal to:

$$V_{MIN} = V_{CC} \frac{e^{kC/\tau} - 1}{e^{C/\tau} - 1} \qquad \text{Equation 1}$$

$$V_{MAX} = V_{MIN} + (V_{CC} - V_{MIN})(1 - e^{-kC/\tau}) \qquad \text{Equation 2}$$

$$= V_{CC}\left(1 - \frac{e^{(1-k)C/\tau} - 1}{e^{C/\tau} - 1}\right)$$

wherein Vcc is a voltage value of the PWM input signal PWMI when asserted, 0 is the voltage value of the PWM input signal PWMI when de-asserted, C is a duration of one cycle of the PWM input signal PWMI, and τ is the RC time constant of the LPF 332 (equal to a product of a resistance value of the filter resistor 332 and a capacitance value of the filter capacitor 334).

The steady-state value $V_{OUTP}$ of the output signal OUTP is then:

$$V_{OUTP} = (V_{MAX} + V_{MIN})/2 \qquad \text{Equation 3}$$

$$= \frac{V_{CC}}{2}\left(1 + \frac{e^{kC/\tau} - e^{(1-k)C/\tau}}{e^{C/\tau} - 1}\right)$$

When a ratio of the RC time constant τ of the LPF 332 to the duration C of one cycle of the PWM input signal PWMI is high, the value $V_{OUTP}$ of the output signal OUTP is substantially proportional to the duty cycle k of the PWM input signal PWMI. For example, when τ=5C, the normalized ratio (i.e. where $V_{OUTP}$=1 when k=0.5) of the $V_{OUTP}$ to k varies from 1.003 near k=0 to 0.9996 near k=0.8, for a maximum non-linearity of less than 0.03% of full-scale output. In another example, when τ=C, the normalized ratio of the $V_{OUTP}$ to k varies from 1.07 near k=0 to 0.990 near k=0.7, for a maximum non-linearity of less than 0.8% of full-scale output.

Accordingly a demodulator according to an embodiment provides an output signal OUTP having a value that accurately indicates the duty cycle of the PWM input signal PWMI. An embodiment may select the ratio of the RC time constant τ of the LPF 332 to the duration C of one cycle of the PWM input signal PWMI according to the accuracy and response time requirements of the application in which the embodiment is being used, with lower ratios providing faster response times and higher ratios providing higher accuracy.

Figure 4:
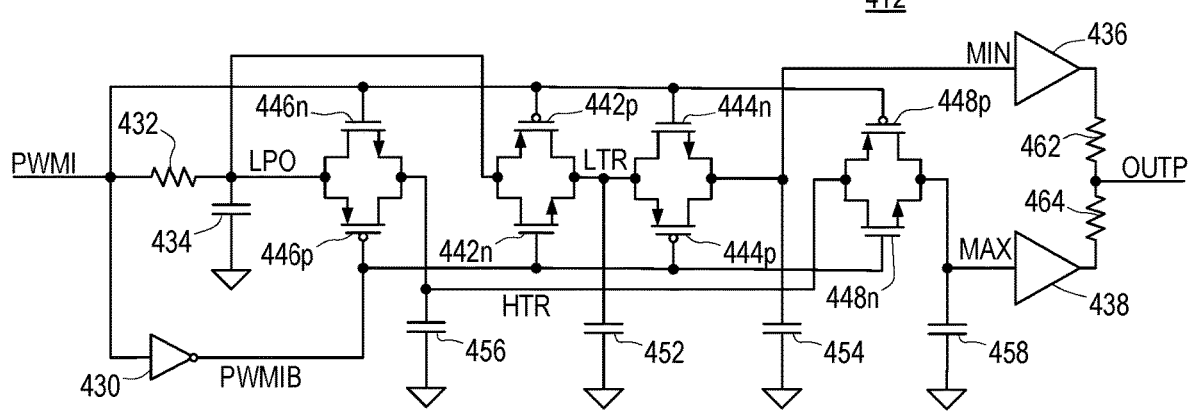
FIG. 4 illustrates a PWM demodulator circuit according to an embodiment.

FIG. 4 illustrates a PWM demodulator circuit 412 according to an embodiment. The PWM demodulator circuit 412 may be an implementation of the PWM demodulator circuit 312 of FIG. 3A. Elements of FIG. 4 having reference characters of the form 4XX are similar to the corresponding elements of FIG. 3A having reference characters of the form 3XX, so descriptions thereof are omitted for brevity. Similarly, signals in FIG. 4 correspond to the like-named signals in FIG. 3A, and description thereof are omitted for brevity.

Referring to FIG. 4 and FIG. 3A, a first low stage n-channel Metal-Oxide-Semiconductor Field Effect Transistor (n-MOSFET) 442n and a first low stage p-channel Metal-Oxide-Semiconductor Field Effect Transistor (p-MOSFET) 442p correspond to an implementation of the first low stage switch 342. A second low stage n-MOSFET 444n and a second low stage p-MOSFET 444p correspond to an implementation of the second low stage switch 344. A first high stage n-MOSFET 446n and a first high stage p-MOSFET 446p correspond to an implementation of the first high stage switch 346. A second high stage n-MOSFET 448n and a second high stage p-MOSFET 448p correspond to an implementation of the second low stage switch 348.

The n-MOSFETs and p-MOSFETs corresponding to each switch are supplied with the control signal for the respective switch and an inverted version of that control signal, respectively. For example, the first low stage switch 342 of FIG. 3A is controlled by the inverted PWM input signal PWMIB, so the first low stage n-MOSFET 442n is also controlled by the inverted PWM input signal PWMIB, and the first low stage p-MOSFET 442p is controlled by the PWM input signal PWMI. The second low stage switch 344 of FIG. 3A is controlled by the PWM input signal PWMI, so the second low stage n-MOSFET 444n is also controlled by the PWM input signal PWMI, and the second low stage p-MOSFET 444p is controlled by the inverted PWM input signal PWMIB.

The PWM demodulator circuit 412 operates as described for the PWM demodulator circuit 312 of FIG. 3A.

Figure 5:
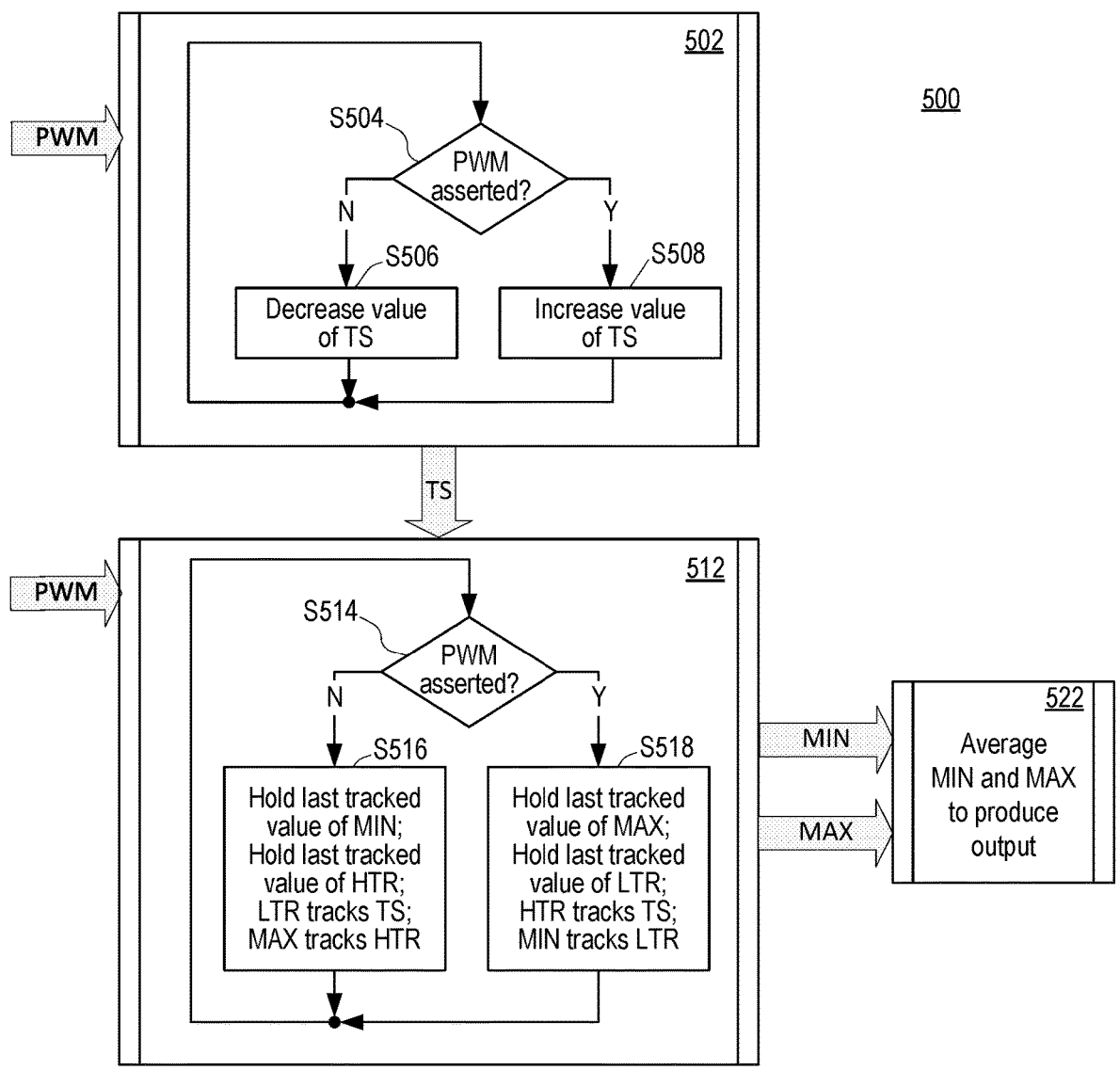
FIG. 5 illustrates a process of demodulating a PWM signal according to an embodiment.

FIG. 5 illustrates a process 500 for demodulating a PWM signal PWM to produce an output indicating a duty cycle of the PWM signal PWM, according to an embodiment. The process 500 includes three subprocesses: a triangle signal (TS) subprocess 502, a Min/Max subprocess 512, and an output subprocess 522.

In an embodiment, the three subprocesses are performed in parallel, but embodiments are not limited thereto.

The TS subprocess 502 receives the PWM signal PWM and produces a triangle signal TS. In an embodiment, the TS subprocess 502 is performed using a low pass filter. In another embodiment, the TS subprocess 502 is performed using an integrator.

At S504, the TS subprocess 502 determines whether the PWM signal PWM is asserted. During periods when the PWM signal PWM is de-asserted, at S504 the TS subprocess 502 proceeds to S506. During periods when the PWM signal PWM is asserted, at S504 the TS subprocess 502 proceeds to S508.

At S506, the TS subprocess 502 decreases a value of the triangle signal TS. In an embodiment, the triangle signal TS is decreased at a rate determined by a time constant of a resistor-capacitor (RC) filter. The TS subprocess 502 then returns to S504.

At S508, the TS subprocess 502 increases a value of the triangle signal TS. In an embodiment, the triangle signal TS is increased at a rate determined by the time constant of the resistor-capacitor (RC) filter. The TS subprocess 502 then returns to S504.

The Min/Max subprocess 512 receives the PWM signal PWM and the triangle signal TS and produces a minimum signal MIN and a maximum signal MAX. The minimum signal MIN indicates a minimum value of the triangle signal TS during each cycle of the PWM signal PWM. The maximum signal MAX indicates to a maximum value of the triangle signal TS during each cycle of the PWM signal PWM.

In an embodiment, the Min/Max subprocess 512 is performed by a low track-and-hold circuit and a high track-and-hold circuit. In an embodiment, each of the track and hold circuits respectively comprises a first sample-and-hold circuit that receives the triangle signal TS and a second sample-and-hold circuit that receives an output of the first sample-and-hold circuit.

At S514, the Min/Max subprocess 512 determines whether the PWM signal PWM is asserted. During periods when the PWM signal PWM is de-asserted, at S514 the Min/Max subprocess 512 proceeds to S516. During periods when the PWM signal PWM is asserted, at S514 the Min/Max subprocess 512 proceeds to S518.

At S516, the Min/Max subprocess 512 performs the following four operations: 1) hold a last tracked value (from S518) of the minimum signal MIN on the minimum signal MIN; 2) hold a last tracked value (from S518) of the High Tracking signal HTR on the High Tracking signal HTR; 3) track a present value of the triangle signal TS on a Low Tracking signal LTR; and 4) track a present value of the High Tracking signal HTR on the maximum signal MAX. The Min/Max subprocess 512 then returns to S514.

In an embodiment, the four operations performed at S516 are performed in parallel.

At S518, the Min/Max subprocess 512 performs the following four operations: 1) hold a last tracked value (from S516) of the maximum signal MAX on the maximum signal MAX; 2) hold a last tracked value (from S516) of the Low Tracking signal LTR on the Low Tracking signal LTR; 3) track a present value of the triangle signal TS on the High Tracking signal HTR; and 4) track a present value of the Low Tracking signal LTR on the minimum signal MIN. The Min/Max subprocess 512 then returns to S514.

In an embodiment, the four operations performed at S518 are performed in parallel.

Note that because the minimum signal MIN and the maximum signal MAX are each, at any given time, either holding a previous value or tracking a signal that is being held, the respective value of the minimum signal MIN and the maximum signal MAX only change when the Min/Max subprocess 512 changes which of S516 and S518 is being performed (that is, when the assertion state of the PWM signal PWM changes).

The output subprocess 522 receives the minimum signal MIN and the maximum signal MAX and generates an output signal having a value that indicates the duty cycle of the PWM signal PWM. The output subprocess 522 produces the output signal by averaging together the respective values of the minimum signal MIN and the maximum signal MAX.

In an embodiment, the output subprocess 522 is performed using a voltage divider and one or more amplifiers. In embodiments, the amplifiers include unity-gain amplifiers.

The circuits and processes according to embodiments operate to demodulate a pulse width modulated signal to produce an indication of a duty cycle of the PWM signal. The circuits and processes may be simple, fast, and easily designed, and may use a low pass filter circuit to produce a triangular signal from the PWM, a track-and-hold circuit to determine minimum and maximum values of the triangular signal during each cycle of the PWM signal, and an averaging circuit to produce an output signal, by averaging the minimum and maximum values.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined. The order of operations described in embodiments is illustrative and may be re-ordered unless otherwise constrained. Further, features of two or more embodiments may be combined to form a new embodiment.

What is claimed is:

1. A circuit comprising:
   a low pass filter circuit to receive a Pulse Width Modulated (PWM) signal and produce a low pass filtered (LPF) signal;
   a track-and-hold circuit to receive the PWM signal and the LPF signal and produce, using the PWM signal and the LPF signal, a minimum signal and a maximum signal; and
   an averaging circuit to receive the minimum signal and the maximum signal and produce, using the minimum signal and the maximum signal, an output signal, wherein a value of the output signal corresponds to a duty cycle of the PWM signal.

2. The circuit of claim 1, wherein the track-and-hold circuit comprises:
   a low track-and-hold circuit to produce the minimum signal using the LPF signal and the PWM signal; and
   a high track-and-hold circuit to produce the maximum signal using LPF signal and the PWM signal.

3. The circuit of claim 2,
   wherein the low track-and-hold circuit comprises:
      a first low stage to produce a low tracked signal to track a value of the LPF signal when the PWM signal is de-asserted and hold a most recent tracked value of the LPF signal when the PWM signal is asserted, and
      a second low stage to produce the minimum signal to track a value of the low tracked signal when the PWM signal is asserted and hold a most recent tracked value of the low tracked signal when the PWM signal is de-asserted; and
   wherein the high track-and-hold circuit comprises:
      a first high stage to produce a high tracked signal to track a value of the LPF signal when the PWM signal is asserted and hold a most recent tracked value of the LPF signal when the PWM signal is de-asserted, and
      a second high stage to produce the maximum signal to track a value of the high tracked signal when the PWM signal is de-asserted and hold a most recent tracked value of the high tracked signal when the PWM signal is asserted.

4. The circuit of claim 3,
   wherein the first low stage comprises a first switch device coupled between the LPF signal and a terminal of a first capacitor and produces the low tracked signal on the terminal of the first capacitor,
   wherein the second low stage comprises a second switch device coupled between the low tracked signal and a terminal of a second capacitor and produces the minimum signal on the terminal of the second capacitor,
   wherein the first high stage comprises a third switch device coupled between the LPF signal and a terminal of a third capacitor and produces the high tracked signal on the terminal of the third capacitor,
   wherein the second high stage comprises a fourth switch device coupled between the high tracked signal and a terminal of a fourth capacitor and produces the maximum signal on the terminal of the fourth capacitor.

5. The circuit of claim 4, wherein the first, second, third, and fourth switch devices each respectively include a p-channel Metal-Oxide-Semiconductor Field Effect Transistor (MOSFET) and an n-channel MOSFET.

6. The circuit of claim 1, wherein the low pass filter circuit comprises:
   a capacitor; and
   a resistor coupled between the PWM signal and a terminal of the capacitor,
   wherein the LPF signal is produced on the terminal of the capacitor.

7. The circuit of claim 1, wherein the averaging circuit comprises:
   a first amplifier having an input coupled to the minimum signal;
   a second amplifier having an input coupled to the maximum signal;
   a first resistor coupled between an output of the first amplifier and the output signal; and
   a second resistor coupled between an output of the second amplifier and the output signal.

8. The circuit of claim 1, further comprising:
   an inverter to receive the PWM signal and produce an inverted PWM signal,
   wherein the track-and-hold circuit receives the inverted PWM signal and produces, using the inverted PWM signal, the PWM signal, and the LPF signal, the minimum signal and the maximum signal.

9. A circuit comprising:
   a first circuit to receive a Pulse Width Modulated (PWM) signal and produce an output signal having a value that increases according to a time constant of the first circuit in response to the PWM signal being asserted and decreases according to the time constant of the first circuit in response to the PWM signal being de-asserted;
   a second circuit to determine, during each cycle of the PWM signal, a maximum value of the output signal and a minimum value of the output signal; and
   a third circuit to produce, using the maximum value and the minimum value, an output value corresponding to a duty cycle of the PWM signal.

10. The circuit claim 9, wherein the second circuit comprises:
    a first low stage having an output that tracks a value of the output signal when the PWM signal is de-asserted and holds the most recently tracked value of the output signal when the PWM signal is asserted; and
    a first high stage having an output that tracks a value of the output signal when the PWM signal is asserted and holds the most recently tracked value of the output signal when the PWM signal is de-asserted,
    wherein the minimum value is determined using the output of the first low stage and the maximum value is determined using the output of the first high stage.

11. The circuit of claim 10, wherein the second circuit further comprises:
    a second low stage to produce the minimum value by tracking the output of the first low stage when the PWM signal is asserted and holding the most recently tracked value of the output of the first low stage when the PWM signal is de-asserted; and
    a second high stage to produce the maximum value by tracking the output of the first high stage when the PWM signal is de-asserted and holding the most recently tracked value of the output of the first low stage when the PWM signal is asserted.

12. The circuit of claim 9, wherein the first circuit comprises a low pass filter circuit.

13. The circuit of claim 9, wherein the third circuit comprises a voltage divider to produce the output value equal to the average of the minimum value and the maximum value.

14. The circuit of claim 13, wherein the third circuit further comprises:
- a first amplifier to receive the minimum value and having an output coupled to a first input of the voltage divider; and
- a second amplifier to receive the maximum value and having an output coupled to a second input of the voltage divider.

15. A method of demodulating a Pulse Width modulated (PWM) signal, the method comprising:
- generating, by a first circuit using the PWM signal, a triangular signal;
- determining, by a second circuit for each cycle of the PWM signal, a minimum value of the triangular signal;
- determining, by the second circuit for each cycle of the PWM signal, a maximum value of the triangular signal; and
- determining, by a third circuit using the minimum value and the maximum value, a value corresponding to a duty cycle of the PWM signal.

16. The method of claim 15,
wherein the minimum value corresponds to a value of the triangular wave at a time when the PWM signal changes from being de-asserted to being asserted, and
wherein the maximum value corresponds to a value of the triangular wave at a time when the PWM signal changes from being asserted to being de-asserted.

17. The method of claim 15,
wherein determining the minimum value comprises tracking a value of the triangular signal in response to the PWM signal being de-asserted and holding the tracked value in response to the PWM signal being asserted, and
wherein determining the maximum value comprises tracking a value of the triangular signal in response to the PWM signal being asserted and holding the tracked value in response to the PWM signal being de-asserted.

18. The method of claim 15, wherein the second circuit determines the minimum value using a first pair of sample-and-hold stages, and determines the maximum value using a second pair of sample-and-hold stages.

19. The method of claim 15, wherein generating the triangular signal comprises low pass filtering the PWM signal.

20. The method of claim 15, wherein determining the value corresponding to the duty cycle of the PWM signal comprises producing an average of the minimum value and the maximum value.

* * * * *